United States Patent
Liu et al.

(10) Patent No.: US 10,334,719 B2
(45) Date of Patent: Jun. 25, 2019

(54) MULTI-LAYER CIRCUIT BOARD CAPABLE OF BEING APPLIED WITH ELECTRICAL TESTING AND METHOD FOR MANUFACTURING THE SAME

(71) Applicant: KINSUS INTERCONNECT TECHNOLOGY CORP., Taoyuan (TW)

(72) Inventors: Chin-Kuan Liu, Taoyuan (TW); Chao-Lung Wang, Taoyuan (TW); Shuo-Hsun Chang, Taoyuan (TW); Yu-Te Lu, Taoyuan (TW); Chin-Hsi Chang, Taoyuan (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 15/826,692

(22) Filed: Nov. 30, 2017

(65) Prior Publication Data
US 2019/0059153 A1    Feb. 21, 2019

(30) Foreign Application Priority Data

Aug. 18, 2017 (TW) .............................. 106128030 A (51) Int. Cl.
*H05K 1/02*        (2006.01)
*H05K 1/09*        (2006.01)
(Continued)

(52) U.S. Cl.
CPC ............ *H05K 1/0268* (2013.01); *H05K 1/09* (2013.01); *H05K 3/064* (2013.01); *H05K 3/467* (2013.01);
(Continued)

(58) Field of Classification Search
CPC ........ H05K 1/0268; H05K 1/09; H05K 3/064; H05K 3/4644; H05K 3/4661; H05K 3/467;
(Continued)

(56) References Cited

U.S. PATENT DOCUMENTS

| 2010/0132997 | A1* | 6/2010 | Hando ............... H01L 23/49816 174/262 |
| 2012/0222894 | A1* | 9/2012 | Kaneko ................. H05K 3/244 174/257 |

(Continued)

*Primary Examiner* — Steven T Sawyer
(74) *Attorney, Agent, or Firm* — Idea Intellectual Limited; Margaret A. Burke; Sam T. Yip (57) ABSTRACT

A multi-layer circuit board capable of being applied with electrical testing includes a patterned metal-interface layer, a metallic delivery loading plate, an electrical connection layer, a conductive corrosion-barrier layer, a bottom dielectric layer, and a multi-layer circuit structure. The multi-layer circuit structure is disposed on the delivery loading plate through the bottom dielectric layer. The top-layer circuit of the multi-layer circuit structure is electrically connected to the conductive corrosion-barrier layer through the bottom-layer circuit and the electrical connection layer. The delivery loading plate and the patterned metal-interface layer expose the conductive corrosion-barrier layer. Therefore, before the multi-layer circuit board is packaged, an electrical testing can be applied to the multi-layer circuit board to check if it can be operated normally. Hence, costs for figuring out reasons of the unqualified electronic component can be reduced, and responsibilities for the unqualified electrical testing result of the electronic component can be clarified.

18 Claims, 6 Drawing Sheets

(51) Int. Cl.
*H05K 3/46* (2006.01)
*H05K 3/06* (2006.01)
(52) U.S. Cl.
CPC ......... *H05K 3/4644* (2013.01); *H05K 3/4661* (2013.01); *H05K 2201/0302* (2013.01); *H05K 2203/072* (2013.01); *H05K 2203/0723* (2013.01)
(58) Field of Classification Search
CPC ..... H05K 2201/0302; H05K 2203/072; H05K 2203/0723; H05K 3/244; H05K 1/0266; H05K 1/188; H05K 2203/0147; H05K 2203/0152
USPC ......................................................... 174/251
See application file for complete search history.

(56) References Cited

U.S. PATENT DOCUMENTS

2013/0134127 A1\* 5/2013 Kodani ............... H01L 21/4846
216/13
2014/0115889 A1\* 5/2014 Lin ...................... H05K 3/4682
29/849

\* cited by examiner

MULTI-LAYER CIRCUIT BOARD CAPABLE OF BEING APPLIED WITH ELECTRICAL TESTING AND METHOD FOR MANUFACTURING THE SAME

CROSS-REFERENCE TO RELATED APPLICATION

This non-provisional application claims priority under 35 U.S.C. § 119(a) to Patent Application No. 106128030 filed in Taiwan, R.O.C. on Aug. 18, 2017, the entire contents of which are hereby incorporated by reference.

FIELD OF INVENTION

The instant disclosure relates to a multi-layer circuit board and method for manufacturing the same, in particular, to a multi-layer circuit board capable of being applied with electrical testing and method for manufacturing the multi-layer circuit board.

BACKGROUND

In electronics industries, circuit board manufacturers are responsible for the production of multi-layer circuit boards, while assembly companies are responsible for wire bonding and packaging the chips on the multi-layer circuit boards and for electrical properties tests of the electronic components after the chips and the circuit boards are packaged to be electronic components in the packaging procedures.

Before the chips and the conventional multi-layer circuit boards are delivering to the assembly company, electrical properties tests can be applied to the chips but cannot be applied to the conventional multi-layer circuit board. As a result, after the packaging procedures, the multi-layer circuit board, units on the multi-layer circuit board, and connections between the multi-layer circuit board and the units have to be checked and analyzed carefully to find problems when the electrical properties tests of the component are not qualified. Nevertheless, the sizes of such kinds of electronic components are quite tiny and the structures of the electronic components are fine. As a result, it takes time and labor to find out the reasons causing the unqualified electrical testing result. Furthermore, the responsibilities for the unqualified electrical testing result cannot be clarified.

SUMMARY OF INVENTION

In view of the problems mentioned above, a multi-layer circuit board capable of being applied with electrical testing and method for manufacturing the same are provided. The multi-layer circuit board can have electrical testing before the multi-layer circuit board is provided for the assembly company for packaging. Therefore, the cost for figuring out reasons of the unqualified electronic component can be reduced, and the responsibilities for the unqualified electrical testing result of the electronic component can be clarified efficiently.

In view of this, an embodiment of the instant disclosure provides a multi-layer circuit board capable of being applied with electrical testing, and the multi-layer circuit board comprises:

a patterned metal interface layer being conductive;
a delivery loading plate overlapping on a top surface of the patterned metal interface layer, the delivery loading plate comprising a first side and a second side opposite to the first side, wherein the second side is connected to the top surface of the patterned metal interface layer, and the delivery loading plate is made of metal;
a bottom dielectric layer overlapping on the first side of the delivery loading plate;
a multi-layer circuit structure overlapping on the bottom dielectric layer and the multi-layer circuit structure comprising:
a bottom-layer circuit on the bottom dielectric layer;
a top dielectric layer on a top side of the bottom-layer circuit; and
a top-layer circuit on the top dielectric layer and electrically connected to the bottom-layer circuit;
a conductive corrosion-barrier layer on the bottom dielectric layer and electrically connected to the bottom-layer circuit; and
an electrical connection layer on the bottom dielectric layer and connected between the bottom-layer circuit and the conductive corrosion-barrier layer; wherein the delivery loading plate and the patterned metal interface layer expose the conductive corrosion-barrier layer.

The multi-layer circuit structure is disposed on the delivery loading plate through the bottom dielectric layer. The delivery loading plate and the patterned metal interface layer expose the conductive corrosion-barrier layer. The top-layer circuit of the multi-layer circuit structure is electrically connected to the conductive corrosion-barrier layer through the bottom-layer circuit and the electrical connection layer. Therefore, before the multi-layer circuit board is delivered to the assembly company or before the multi-layer circuit board is packaged with chips, an electrical testing can be applied to the multi-layer circuit board to check if the multi-layer circuit board can be operated normally or not. Hence, not only the product quality of multi-layer circuit board can be checked, but also the cost for figuring out reasons of the unqualified electronic component can be reduced. Moreover, the responsibilities for the unqualified electrical testing result of the electronic component can be clarified efficiently.

In one embodiment, the bottom-layer circuit is protruding from the bottom dielectric layer and the top-layer circuit is protruding from the top dielectric layer.

In one embodiment, the multi-layer circuit structure further comprises an inner dielectric layer, an inner-layer circuit, a first conduction pillar, a second conduction pillar, and a third conduction pillar. The inner dielectric layer is connected to the top side of the bottom-layer circuit. The inner-layer circuit is connected between the inner dielectric layer and the top dielectric layer. The inner-layer circuit is protruding from the inner dielectric layer. The first conduction pillar downwardly inserts on the bottom dielectric layer and the first conduction pillar is connected between the electrical connection layer and the bottom-layer circuit. The second conduction pillar downwardly inserts on the inner dielectric layer and the second conduction pillar is connected between the bottom-layer circuit and the inner-layer circuit. The third conduction pillar downwardly inserts on the top dielectric layer and the third conduction pillar is connected between the top-layer circuit and the inner-layer circuit. The top-layer circuit is electrically connected to the conductive corrosion-barrier layer through the third conduction pillar, the inner-layer circuit, the second conduction pillar, the bottom-layer circuit, the first conduction pillar, and the electrical connection layer.

In one embodiment, the conductive corrosion-barrier layer and the electrical connection layer are embedded on the bottom dielectric layer.

In one embodiment, the conductive corrosion-barrier layer comprises at least one of gold, nickel, tin, iron, and titanium.

In one embodiment, the conductive corrosion-barrier layer comprises a gold layer and a nickel layer, the nickel layer is connected between the electrical connection layer and the gold layer.

In one embodiment, the patterned metal interface layer comprises copper.

In one embodiment, the multi-layer circuit board further comprises a solder mask layer, wherein the solder mask layer exposes the top-layer circuit to cover the top dielectric layer.

In view of this, an embodiment of the instant disclosure provides a manufacturing method for a multi-layer circuit board capable of being applied with electrical testing, and the manufacturing method comprises:

providing a first loading plate, wherein the first loading plate comprises a substrate, a conductive layer, and a metal interface layer, the conductive layer and the metal interface layer are sequentially overlapping on the substrate, a bottom surface of the metal interface layer is detachably connected to the conductive layer, and the metal interface layer is conductive;

forming a second loading plate overlapping on the metal interface layer by electroplating the first loading plate, wherein the second loading plate has a first side and a second side opposite to the first side, the second side is connected to a top surface of the metal interface layer;

forming a first patterned photoresist layer overlapping on the first side of the second loading plate;

forming a conductive corrosion-barrier layer and an electrical connection layer sequentially on the first side of the second loading plate by electroplating the second loading plate, wherein the conductive corrosion-barrier layer is conductive, and the conductive corrosion-barrier layer is connected between the electrical connection layer and the second loading plate;

removing the first patterned photoresist layer;

disposing a bottom dielectric layer on the first side of the second loading plate and the electrical connection layer to enclose the electrical connection layer and the conductive corrosion-barrier layer;

forming a multi-layer circuit structure on the bottom dielectric layer, wherein the multi-layer circuit structure comprises a bottom-layer circuit, a top dielectric layer, and a top-layer circuit, the bottom-layer circuit is overlapping on the bottom dielectric layer and is connected to the electrical connection layer, the top dielectric layer is on a top side of the bottom-layer circuit, the top-layer circuit is on a top surface of the top dielectric layer and electrically connected to the bottom-layer circuit;

forming a second patterned photoresist layer enclosing the top-layer circuit and covering the top dielectric layer, and peeling off the substrate and the conductive layer;

forming a third patterned photoresist layer on the bottom surface of the metal interface layer;

etching the metal interface layer and the second loading plate to obtain a patterned metal interface layer and a delivery loading plate, wherein the patterned metal interface layer is connected between the third patterned photoresist layer and the delivery loading plate, the delivery loading plate is connected between the bottom dielectric layer and the patterned metal interface layer, and the third patterned photoresist layer, the delivery loading plate, and the patterned metal interface layer expose the conductive corrosion-barrier layer; and removing the second patterned photoresist layer and the third patterned photoresist layer to obtain the multi-layer circuit board.

According to the multi-layer circuit board manufactured by the manufacturing method, the multi-layer circuit structure is disposed on the delivery loading plate through the bottom dielectric layer, the delivery loading plate and the patterned metal interface layer expose the conductive corrosion-barrier layer, and the top-layer circuit of the multi-layer circuit structure is electrically connected to the conductive corrosion-barrier layer through the bottom-layer circuit and the electrical connection layer. Therefore, before the multi-layer circuit board is delivered to the assembly company or before the multi-layer circuit board is packaged with chips, an electrical testing can be applied to the multi-layer circuit board to check if the multi-layer circuit board can be operated normally or not. Hence, not only the product quality of multi-layer circuit board can be checked, but also the cost for figuring out reasons of the unqualified electronic component can be reduced. Moreover, the responsibilities for the unqualified electrical testing result of the electronic component can be clarified efficiently.

In one embodiment, the step of forming a conductive corrosion-barrier layer and an electrical connection layer sequentially on the first side of the second loading plate comprises: electroplating the second loading plate in a gold solution having a concentration from 2.8 g/l to 6.0 g/l under a voltage from 0.1 volts to 5 volts to obtain a gold layer on the first side of the second loading plate; electroless plating the gold layer in a nickel sulfate hexahydrate (NiSO$_4$.6H$_2$O) solution having a concentration from 260 g/l to 310 g/l to obtain a nickel layer on the gold layer and to obtain the conductive corrosion-barrier layer; and electroplating the nickel layer in a copper sulfate solution having a concentration from 70 g/l to 90 g/l under a voltage from 5 volts to 6 volts to obtain the electrical connection layer on the conductive corrosion-barrier layer.

BRIEF DESCRIPTION OF THE DRAWINGS

The disclosure will become more fully understood from the detailed description given herein below for illustration only, and thus not limitative of the disclosure, wherein.

DETAILED DESCRIPTION OF THE INVENTION

Drawings and embodiments are provided below for elucidating the technical features of the instant disclosure.

Figure 1:
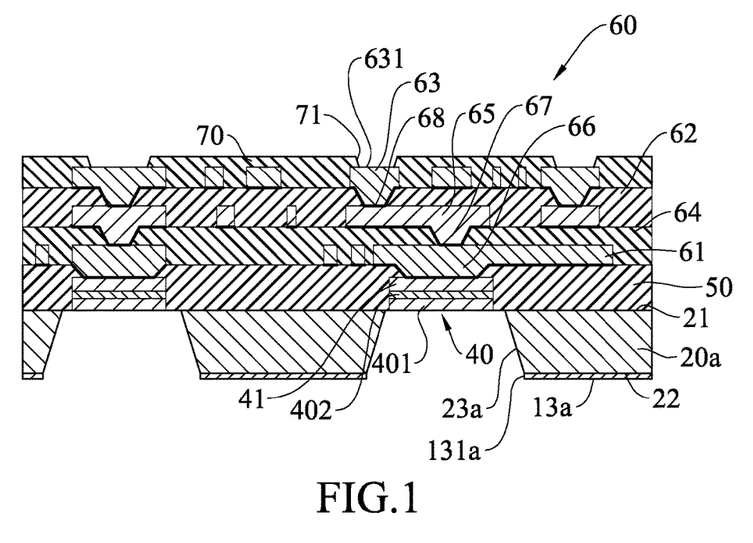
FIG. 1 illustrates a sectional view of a multi-layer circuit board capable of being applied with electrical testing, according to an exemplary embodiment of the instant disclosure.

Please refer to FIG. 1. An exemplary embodiment of the instant disclosure provides a multi-layer circuit board capable of being applied with electrical testing, and the multi-layer circuit board comprises a patterned metal interface layer 13a, a delivery loading plate 20a, a bottom dielectric layer 50, a multi-layer circuit structure 60, a conductive corrosion-barrier layer 40, an electrical connection layer 41, and a solder mask layer 70.

Please refer to FIG. 1. The patterned metal interface layer 13*a* is conductive. The delivery loading plate 20*a* is made of metal. The delivery loading plate 20*a* is overlapping on a top surface of the patterned metal interface layer 13*a*. The delivery loading plate 20*a* comprises a first side 21 and a second side 22 opposite to the first side 21. The second side 22 of the delivery loading plate 20*a* is connected to the top surface of the patterned metal interface layer 13*a*. In one embodiment, the delivery loading plate 20*a* and the patterned metal interface layer 13*a* are made of copper, but embodiments are not limited thereto. In some embodiments, the delivery loading plate 20*a* may be made of copper, nickel, aluminum, or iron.

Please refer to FIG. 1. The bottom dielectric layer 50 is overlapping on the first side 21 of the delivery loading plate 20*a*. In one embodiment, the bottom dielectric layer 50 is an Ajinomoto build-up film (ABF), but embodiments are not limited thereto. In some embodiments, the bottom dielectric layer 50 is a plastic sheet made of bismaleimide triazine (BT) and glass fiber.

Please refer to FIG. 1. The multi-layer circuit structure 60 is formed on the bottom dielectric layer 50. The multi-layer circuit structure 60 comprises a bottom-layer circuit 61, a top dielectric layer 62, and a top-layer circuit 63. The bottom-layer circuit 61 is protruding from the bottom dielectric layer 50. The top dielectric layer 62 is on a top side of the bottom-layer circuit 61. The top-layer circuit 63 is protruding from a top surface of the top dielectric layer 62 and electrically connected to the bottom-layer circuit 61.

Please refer to FIG. 1. The conductive corrosion-barrier layer 40 is embedded on the bottom dielectric layer 50. In other words, the bottom dielectric layer 50 is divided into a plurality of portions, the portions of the bottom dielectric layer 50 is spaced by the conductive corrosion-barrier layers 40, and the delivery loading plate 20*a* is at the plurality of portions of the bottom dielectric layer 50. Moreover, in one embodiment, the delivery loading plate 20*a* is not in contact with the conductive corrosion-barrier layers 40. As shown in FIG. 1, in one embodiment, the plurality of portions of the conductive corrosion-barrier layer 40 is isolated from each other. As shown in FIG. 1, in one embodiment, at least one of the plurality of portions of the bottom dielectric layer 50 is not positioned at an edge of the multi-layer circuit board, and the at least one of the plurality of portions of the bottom dielectric layer 50 is in contact with the delivery loading plate 20*a*. As shown in FIG. 1, in one embodiment, a portion of the delivery loading plate 20*a* is not positioned at an edge of the multi-layer circuit board in a horizontal direction.

Please refer to FIG. 1. The electrical connection layer 41 is embedded on the bottom dielectric layer 50 and connected between the bottom-layer circuit 61 and the conductive corrosion-barrier layer 40. Accordingly, the bottom-layer circuit 61 is electrically connected to the conductive corrosion-barrier layer 40 through the electrical connection layer 41.

In one embodiment, the conductive corrosion-barrier layer 40 is made of gold and nickel, and the electrical connection layer 41 is made of copper, but embodiments are not limited thereto. Specifically, in one embodiment, the conductive corrosion-barrier layer 40 comprises a gold layer 401 and a nickel layer 402, and the nickel layer 402 is connected between the electrical connection layer 41 and the gold layer 401. In some embodiments, the conductive corrosion-barrier layer 40 is made of gold or nickel, and the electrical connection layer 41 is made of copper.

In one embodiment, as shown in FIG. 1, a width of the gold layer 401, a width of the nickel layer 402, and a width of the electrical connection layer 41 correspond to each other.

Please refer to FIG. 1. In one embodiment, the multi-layer circuit structure 60 comprises an inner dielectric layer 64, an inner-layer circuit 65, a first conduction pillar 66, a second conduction pillar 67, and a third conduction pillar 68. The inner dielectric layer 64 is connected to the top side of the bottom-layer circuit 61. The inner-layer circuit 65 is connected between the inner dielectric layer 64 and the top dielectric layer 62. The inner-layer circuit 65 is protruding from the inner dielectric layer 64. The first conduction pillar 66 downwardly inserts on the bottom dielectric layer 60, and the first conduction pillar 66 is connected between the electrical connection layer 41 and the bottom-layer circuit 61, so that the electrical connection layer 41 and the bottom-layer circuit 61 are electrically connected with each other. The second conduction pillar 67 downwardly inserts on the inner dielectric layer 64, and the second conduction pillar 67 is connected between the bottom-layer circuit 61 and the inner-layer circuit 65, so that the bottom-layer circuit 61 and the inner-layer circuit 65 are electrically connected with each other. The third conduction pillar 68 downwardly inserts on the top dielectric layer 62, and the third conduction pillar 68 is connected between the top-layer circuit 63 and the inner-layer circuit 65, so that the top-layer circuit 63 and the inner-layer circuit 62 are electrically connected with each other. That is, the top-layer circuit 63 and the conductive corrosion-barrier layer 40 are electrically connected with each other through the third conduction pillar 68, the inner-layer circuit 65, the second conduction pillar 67, the bottom-layer circuit 61, the first conduction pillar 66, and the electrical connection layer 41.

In one embodiment, a surface of the electrical connection layer 41 is in contact with a protruding portion of the first conduction pillar 66. A protruding portion of the third conduction pillar 68 is in contact with a surface of the second conduction pillar 67, and a protruding portion of the second conduction pillar 67 is in contact with a surface of the first conduction pillar 66, and the surface of the first conduction pillar 66 is opposite to the protruding portion of the first conduction pillar 66.

In one embodiment, both or one of the top dielectric layer 62 and the inner dielectric layer 64 is an Ajinomoto build-up film, but embodiments are not limited thereto. In some embodiments, both or one of the top dielectric layer 62 and the inner dielectric layer 64 is a plastic sheet made of bismaleimide triazine and glass fiber.

Please refer to FIG. 1. The solder mask layer 70 exposes the top-layer circuit 63 and covers the top dielectric layer 62. Specifically, in one embodiment, the solder mask layer 70 has a through hole 71, and the through hole 71 is connected to the top-layer circuit 63, so that the solder mask layer 70 exposes the top-layer circuit 63. More specifically, in one embodiment, the top-layer circuit 63 comprises a predefined connection area 631, and the through hole 71 is connected to the predefined connection area 631 of the top-layer circuit 63, so that the solder mask layer 70 exposes the predefined connection area 631 of the top-layer circuit 63.

Please refer to FIG. 1. The delivery loading plate 20*a* and the patterned metal interface layer 13*a* expose the conductive corrosion-barrier layer 40. Specifically, in one embodiment, the patterned metal interface layer 13*a* has an opening 131*a*, and the delivery loading plate 20*a* has a via 23*a* connected to the opening 131*a*. The via 23*a* is defined through the delivery loading plate 20*a* from the first side 21 to the second side 22, and the via 23a is connected to the conductive corrosion-barrier layer 40. Accordingly, the delivery loading plate 20a and the patterned metal interface layer 13a expose the conductive corrosion-barrier layer 40. Wherein, the via 23a may be trapezoid-shaped.

Figure 2:
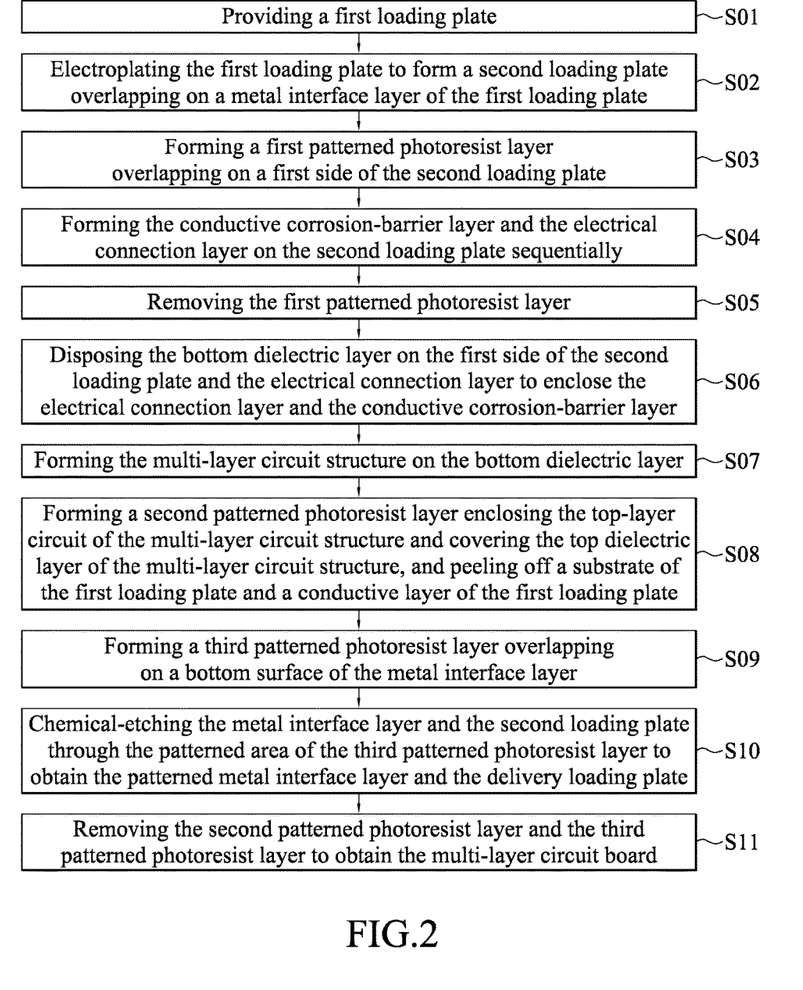
FIG. 2 illustrates a flowchart of a manufacturing method of the multi-layer circuit board of the exemplary embodiment.

Please refer to FIG. 2. The manufacturing method for the multi-layer circuit board comprises: providing a first loading plate 10 (step S1), electroplating the first loading plate 10 to form a second loading plate 20 overlapping on a metal interface layer 13 of the first loading plate 10 (step S2), forming a first patterned photoresist layer 30 overlapping on a first side 21 of the second loading plate 20 (step S3), forming the conductive corrosion-barrier layer 40 and the electrical connection layer 41 on the second loading plate 20 sequentially (step S4), removing the first patterned photoresist layer 30 (step S5), disposing the bottom dielectric layer 50 on the first side 21 of the second loading plate 20 and the electrical connection layer 41 to enclose the electrical connection layer 41 and the conductive corrosion-barrier layer 40 (step S6), forming the multi-layer circuit structure 60 on the bottom dielectric layer 50 (step S7), forming a second patterned photoresist layer 30a enclosing the top-layer circuit 63 of the multi-layer circuit structure 60 and covering the top dielectric layer 62 of the multi-layer circuit structure 60, and peeling off a substrate 11 of the first loading plate 10 and a conductive layer 12 of the first loading plate 10 (step S8), forming a third patterned photoresist layer 30b overlapping on a bottom surface of the metal interface layer 13 (step S9), chemical-etching the metal interface layer 13 and the second loading plate 20 through the patterned area of the third patterned photoresist layer 30b to obtain the patterned metal interface layer 13a and the delivery loading plate 20a (step S10), and removing the second patterned photoresist layer 30a and the third patterned photoresist layer 30b to obtain the multi-layer circuit board (step S11).

Figure 3A:
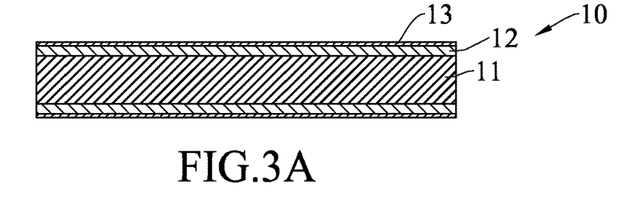
FIGS. 3A to 3M illustrate schematic views showing the steps of the manufacturing method of the multi-layer circuit board of the exemplary embodiment.

Please refer to FIG. 3A. In the step of providing a first loading plate 10 (step S1), the first loading plate 10 comprises a substrate 11, a conductive layer 12, and a metal interface layer 13. The conductive layer 12 is on a surface of the substrate 11. The metal interface layer 13 is detachably on a surface of the conductive layer 12 distant from the substrate 11. In other words, the conductive layer 12 is between the substrate 11 and the metal interface layer 13. That is, the conductive layer 12 and the metal interface layer 13 are sequentially overlapping on the substrate 11, and a bottom surface of the metal interface layer 13 is detachably connected to the conductive layer 12. Wherein, the metal interface layer 13 is conductive. In one embodiment, the metal interface layer 13 is made of copper, but embodiments are not limited thereto.

Figure 3B:
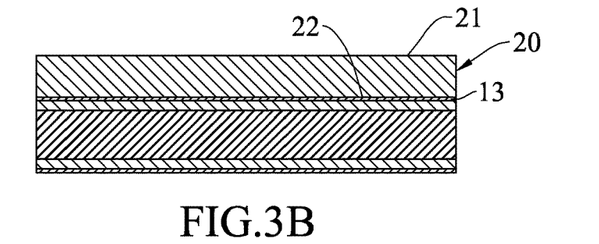

Please refer to FIG. 3B. In the step of electroplating the first loading plate 10 to form a second loading plate 20 overlapping on a top surface of the metal interface layer 13 (step S2), the second loading plate 20 has the first side 21 and the second side 22, and the second side 22 is connected to the top surface of the metal interface layer 13.

In one embodiment, in the step of electroplating the first loading plate 10 to form a second loading plate 20 overlapping on a top surface of the metal interface layer 13 (step S2), the first loading plate 10 is electroplated in a copper sulfate solution having a concentration from 70 g/l to 90 g/l under a voltage from 5 volts to 6 volts for 169 minutes to obtain the second loading plate 20. In other words, the second loading plate 20 is made of copper, but embodiments are not limited thereto. In some embodiments, the second loading plate 20 may be made of aluminum, iron, or nickel.

Figure 3C:
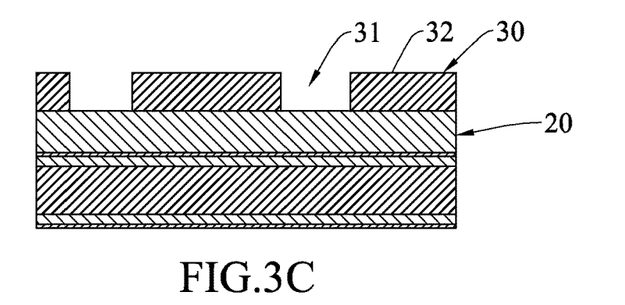

Please refer to FIG. 3C. In the step of forming a first patterned photoresist layer 30 overlapping on the first side 21 of the second loading plate 20 (step S3), the first patterned photoresist layer 30 comprises a patterned area 31 and a reserved area 32 connected to the patterned area 31. The patterned area 31 of the first patterned photoresist layer 30 exposes the first side 21, while the reserved area 32 of the first patterned photoresist layer 30 covers the first side 21. In other words, the first patterned photoresist layer 30 exposes a portion of the first side 21 and covers the other portion of the first side 21. Specifically, in one embodiment, in the step of forming a first patterned photoresist layer 30 overlapping on the first side 21 of the second loading plate 20 (step S3), firstly a first photoresist layer is overlapping on the second loading plate 20; then, the image of a first film is transferred to the first photoresist layer by exposure, so that an image-transferred first photoresist layer is obtained; next, the image-transferred first photoresist layer is developed, so that the first patterned photoresist layer 30 is obtained.

Figure 3D:
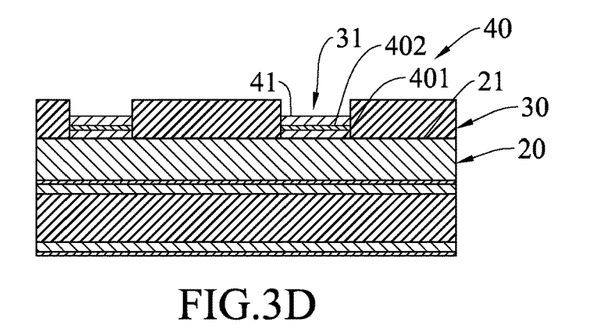

Please refer to FIG. 3D. In the step of forming the conductive corrosion-barrier layer 40 and the electrical connection layer 41 on the second loading plate 20 sequentially (step S4), the conductive corrosion-barrier layer 40 is conductive, and the conductive corrosion-barrier layer 40 and the electrical connection layer 41 are in the patterned area 31 of the first patterned photoresist layer 30. The conductive corrosion-barrier layer 40 is connected between the electrical connection layer 41 and the second loading plate 20, so that the electrical connection layer 41 and the second loading plate 20 are separated by the conductive corrosion-barrier layer 40. Specifically, in one embodiment, the conductive corrosion-barrier layer 40 and the electrical connection layer 41 are on the first side 21 of the second loading plate 20.

In one embodiment, in the step of forming the conductive corrosion-barrier layer 40 and the electrical connection layer 41 on the second loading plate 20 sequentially (step S4), firstly the second loading plate 20 is electroplated in a gold solution having a concentration from 2.8 g/l to 6.0 g/l under a voltage from 0.1 volts to 5 volts for 8 minutes to obtain the gold layer 401 on the second loading plate 20; then, the gold layer 401 is electroless-plated in a nickel sulfate hexahydrate ($NiSO_4 \cdot 6H_2O$) solution having a concentration from 260 g/l to 310 g/l to obtain a nickel layer 402 on the gold layer 401 and to obtain the conductive corrosion-barrier layer 40; next, the nickel layer 402 is electroplated in a copper sulfate solution having a concentration from 70 g/l to 90 g/l under a voltage from 5 volts to 6 volts for 11 minutes to obtain the electrical connection layer 41 on the conductive corrosion-barrier layer 40. Wherein, the conductive corrosion-barrier layer 40 comprises the gold layer 401 and the nickel layer 402, and the nickel layer 402 is connected between the electrical connection layer 41 and the gold layer 401.

Figure 3E:
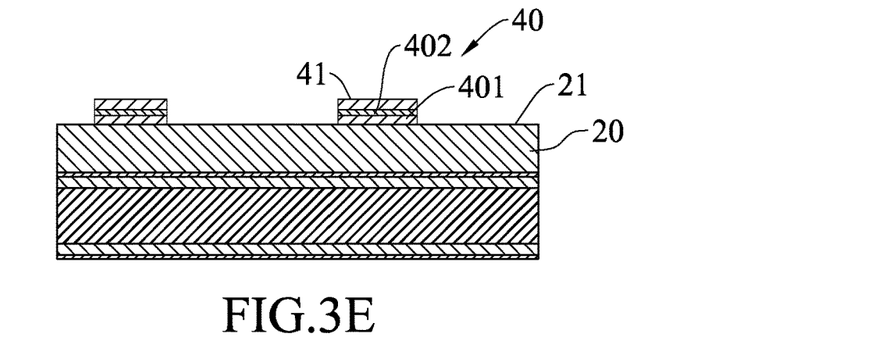

Please refer to FIG. 3E. In one embodiment, in the step of removing the first patterned photoresist layer 30 (step S5), a stripping liquid is applied to remove the first patterned photoresist layer 30.

Figure 3F:
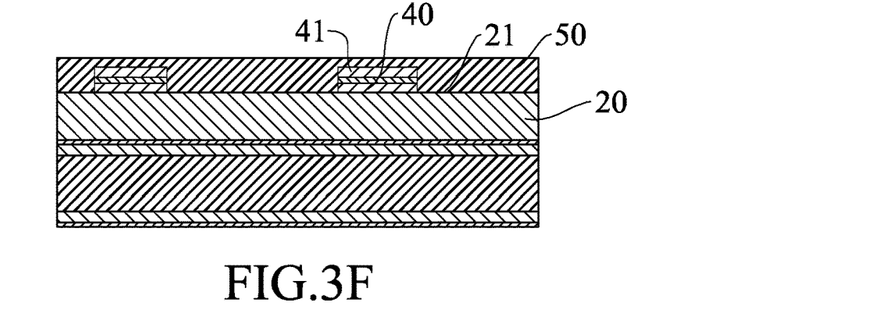

Please refer to FIG. 3F. In one embodiment, in the step of disposing the bottom dielectric layer 50 on the first side 21 of the second loading plate 20 and the electrical connection layer 41 to enclose the electrical connection layer 41 and the conductive corrosion-barrier layer 40 (step S6), an Ajinomoto build-up film is used as the bottom dielectric layer 50. In some embodiments, the bottom dielectric layer 50 is a plastic sheet made of bismaleimide triazine and glass fiber.

Figure 3G:
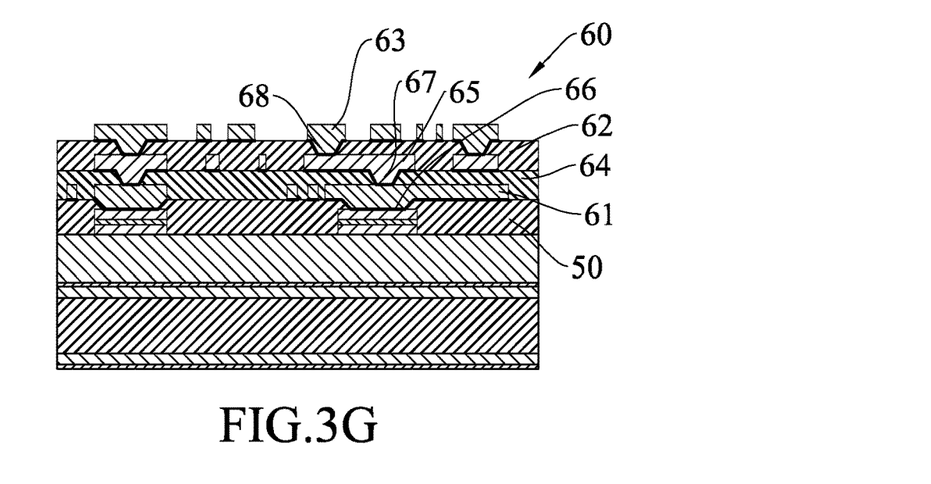

Please refer to FIG. 3G. In the step of forming the multi-layer circuit structure 60 on the bottom dielectric layer 50 (step S7), the multi-layer circuit structure 60 comprises the bottom-layer circuit 61, the top-layer circuit 63, and the top dielectric layer 62. In one embodiment, the multi-layer circuit structure 60 further comprises the inner dielectric layer 64, the inner-layer circuit 65, the first conduction pillar 66, the second conduction pillar 67, and the third conduction pillar 68. Both or one of the top dielectric layer 62 and the inner dielectric layer 64 is an Ajinomoto build-up film, but embodiments are not limited thereto. In some embodiments, both or one of the top dielectric layer 62 and the inner dielectric layer 64 is a plastic sheet made of bismaleimide triazine and glass fiber.

Figure 3H:
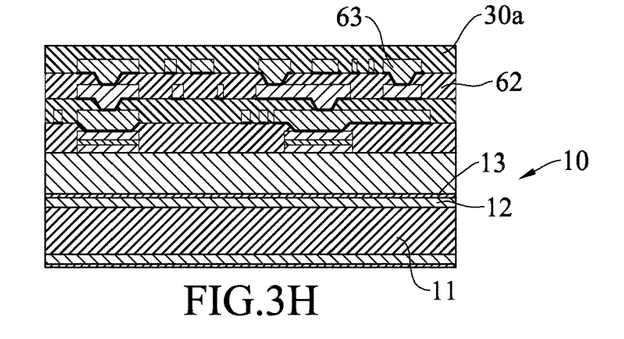
Figure 3I:
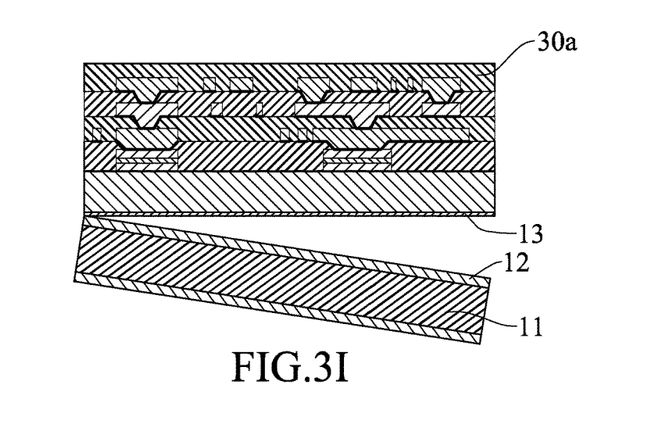

Please refer to FIGS. 3H and 3I. The second patterned photoresist layer 30a is disposed on the top-layer circuit 63 of the multi-layer circuit structure 60 and the top dielectric layer 62 of the multi-layer circuit structure 60, and the substrate 11 of the first loading plate 10 and the conductive layer 12 of the first loading plate 10 are peeled off. Specifically, in one embodiment, in the step of forming a second patterned photoresist layer 30a enclosing the top-layer circuit 63 of the multi-layer circuit structure 60 and covering the top dielectric layer 62 of the multi-layer circuit structure 60, and peeling off a substrate 11 of the first loading plate 10 and a conductive layer 12 of the first loading plate 10 (step S8), firstly a second photoresist layer is enclosing the top-layer circuit 63 and covering the top dielectric layer 62; then, the second photoresist layer is exposed to obtain an exposed second photoresist layer; next, the exposed second photoresist layer is developed to obtain the second patterned photoresist layer 30a; and then, the conductive layer 12 is detached from the metal interface layer 13, so that the conductive layer 12 and the substrate 11 are peeled off.

Figure 3J:
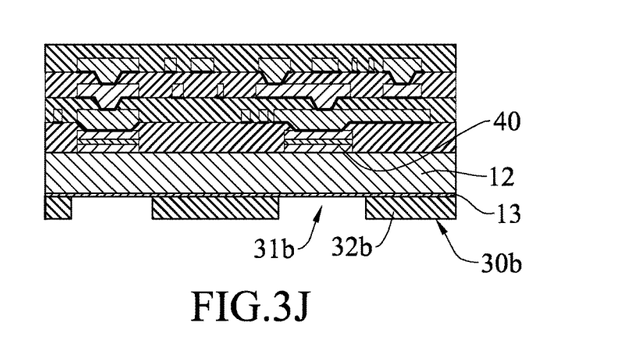

Please refer to FIG. 3J. In the step of forming a third patterned photoresist layer 30b overlapping on a bottom surface of the metal interface layer 13 (step S9), the third patterned photoresist layer 30b comprises a patterned area 31b and a reserved area 32b connected to the patterned area 31b. The patterned area 31b of the third patterned photoresist layer 30b exposes the bottom surface of the metal interface layer 13, the reserved area 32b of the third patterned photoresist layer 30b covers the bottom surface of the metal interface layer 13, and the position of the patterned area 31b of the third patterned photoresist layer 30b is opposite to the position of the conductive corrosion-barrier layer 40. In other words, the third patterned photoresist layer 30b exposes a portion of the bottom surface of the metal interface layer 13 and covers the other portion of the bottom surface of the metal interface layer 13. Specifically, in one embodiment, in the step of forming a third patterned photoresist layer 30b overlapping on a bottom surface of the metal interface layer 13, firstly a third photoresist layer is overlapping on the bottom surface of the metal interface layer 13; then, the image of a second film is transferred to the third photoresist layer by exposure, so that an image-transferred third photoresist layer is obtained; next, the image-transferred third photoresist layer is developed, so that the third patterned photoresist layer 30b is obtained.

Figure 3K:
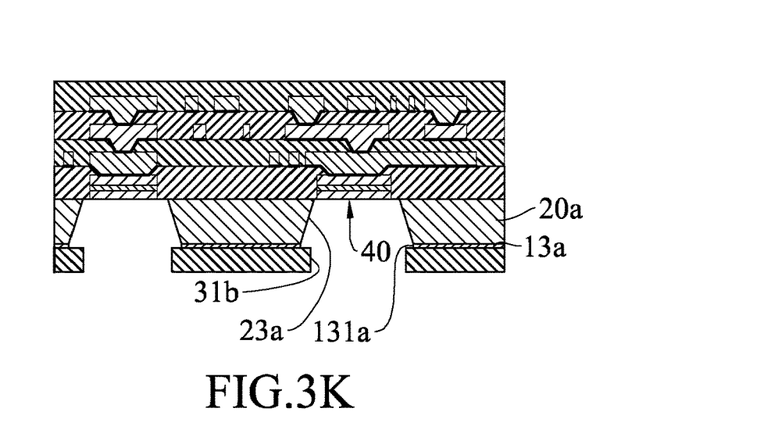

Please refer to FIG. 3K. In the step of chemical-etching the metal interface layer 13 and the second loading plate 20 through the patterned area of the third patterned photoresist layer 30b to obtain the patterned metal interface layer 13a and the delivery loading plate 20a (step S10), the patterned metal interface layer 13a is connected between the third patterned photoresist layer 30b and the delivery loading plate 20a, the delivery loading plate 20a is connected between the bottom dielectric layer 50 and the patterned metal interface layer 13a, and the patterned area 31b of the third patterned photoresist layer 30b, the delivery loading plate 20a, and the patterned metal interface layer 13a expose the conductive corrosion-barrier layer 40. Specifically, in one embodiment, the opening 131a of the patterned metal interface layer 13a is connected to the patterned area 31b of the third patterned photoresist layer 30b, and the via 23a of the delivery loading plate 20a is connected between the conductive corrosion-barrier layer 40 and the opening 131a. Accordingly, the patterned area 31b of the third patterned photoresist layer 30b, the delivery loading plate 20a, and the patterned metal interface layer 13a expose the conductive corrosion-barrier layer 40.

In one embodiment, In the step of chemical-etching the metal interface layer 13 and the second loading plate 20 through the patterned area 31b of the third patterned photoresist layer 30b to obtain the patterned metal interface layer 13a and the delivery loading plate 20a, the metal interface layer 13 and the second loading plate 20 are chemical-etched by a basic copper-etching liquid having a $Cu^{2+}$ concentration from 135 g/l to 175 g/l.

Figure 3L:
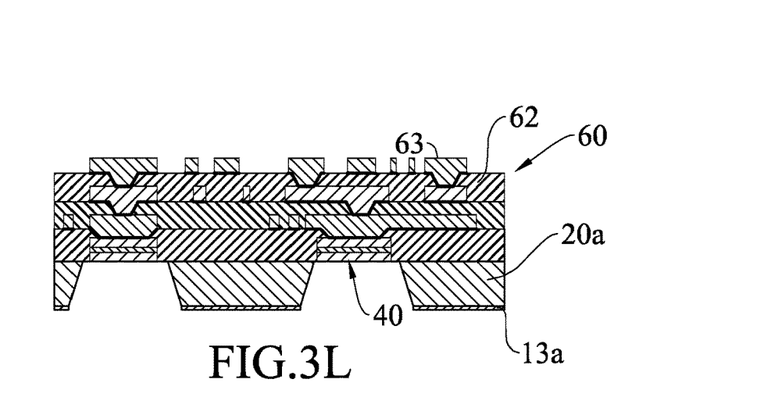
Figure 3M:
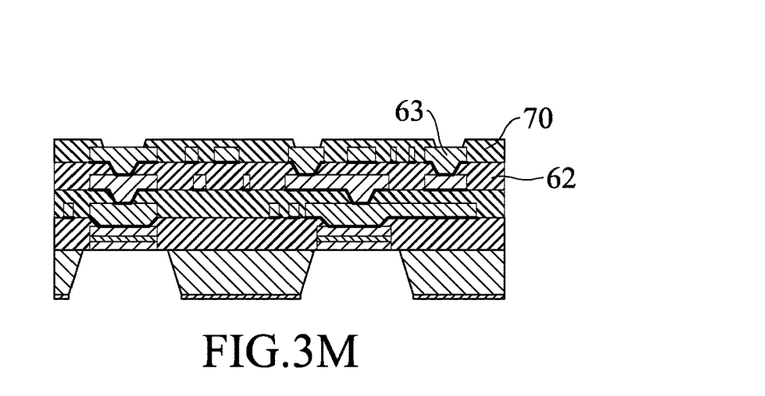

Please refer to FIGS. 3L and 3M. In the step of removing the second patterned photoresist layer 30a and the third patterned photoresist layer 30b to obtain the multi-layer circuit board (step S11), firstly the second patterned photoresist layer 30a and the third patterned photoresist layer 30b are removed by a stripping liquid, and then a solder mask layer 70 exposing the top-layer circuit 63 and covering the top dielectric layer 62 is formed, so that the multi-layer circuit board capable of being applied with electrical testing is obtained.

In one embodiment, the first patterned photoresist layer 30, the second patterned photoresist layer 30a, and the third patterned photoresist layer 30b are made of dried photoresists.

In one embodiment, the electrical connection layer 41 and the bottom dielectric layer 50 are made of different materials.

The multi-layer circuit structure 60 is disposed on the delivery loading plate 20a through the bottom dielectric layer 50, the delivery loading plate 20a and the patterned metal interface layer 13a expose the conductive corrosion-barrier layer 40, and the top-layer circuit 63 of the multi-layer circuit structure 60 is electrically connected to the conductive corrosion-barrier layer 40 through the bottom-layer circuit 61 and the electrical connection layer 41. Therefore, before the multi-layer circuit board is delivered to the assembly company or before the multi-layer circuit board is packaged with chips, an electrical testing can be applied to the multi-layer circuit board to check the circuit between the top-layer circuit 63 and the conductive corrosion-barrier layer 40 is conductive or not. In other words, before the multi-layer circuit board is packaged with the chips, the multi-layer circuit board can be checked if it can be operated normally. Hence, not only the product quality of multi-layer circuit board can be checked, but also the cost for figuring out reasons of the unqualified electronic component can be reduced. Moreover, the responsibilities for the unqualified electrical testing result of the electronic component can be clarified efficiently.

Furthermore, since the delivery loading plate 20a is made of metal, the delivery loading plate 20a can provide a proper supporting force for the electrical connection layer 41, the conductive corrosion-barrier layer 40, the bottom dielectric layer 50, the multi-layer circuit structure 60, and the solder mask layer 70. Hence, the bottom dielectric layer 50, the top dielectric layer 52 of the multi-layer circuit structure 60, and the inner dielectric layer 64 of the multi-layer circuit board

60 may exclude glass fiber. For instance, the bottom dielectric layer 50, the top dielectric layer 62, and the inner dielectric layer 64 may be Ajinomoto build-up films. Owning to excluding from glass fiber, the Ajinomoto build-up films have thinner thicknesses as compared with plastic sheets having glass fiber (e.g., the plastic sheets made of bismaleimide triazine (BT) and glass fiber). Therefore, when the Ajinomoto build-up films are used for making the bottom dielectric layer 50, the top dielectric layer 62, or the inner dielectric layer 64, the overall thickness of the multi-layer circuit board can be reduced.

What is claimed is:

1. A multi-layer circuit board capable of being applied with electrical testing, the multi-layer circuit board comprising:
    a patterned metal interface layer being conductive;
    a delivery loading plate overlapping on a top surface of the patterned metal interface layer, the delivery loading plate comprising a first side and a second side opposite to the first side, wherein the second side is connected to the top surface of the patterned metal interface layer, and the delivery loading plate is made of metal;
    a bottom dielectric layer overlapping on the first side of the delivery loading plate;
    a multi-layer circuit structure overlapping on the bottom dielectric layer and the multi-layer circuit structure comprising:
        a bottom-layer circuit on the bottom dielectric layer;
        a top dielectric layer on a top side of the bottom-layer circuit; and
        a top-layer circuit on the top dielectric layer and electrically connected to the bottom-layer circuit;
    a conductive corrosion-barrier layer on the bottom dielectric layer and electrically connected to the bottom-layer circuit; and
    an electrical connection layer on the bottom dielectric layer and connected between the bottom-layer circuit and the conductive corrosion-barrier layer; wherein the delivery loading plate and the patterned metal interface layer expose the conductive corrosion-barrier layer;
    wherein the conductive corrosion-barrier layer comprises a gold layer and a nickel layer, the nickel layer is connected between the electrical connection layer and the gold layer, a width of the gold layer, a width of the nickel layer, and a width of the electrical connection layer correspond to each other;
    wherein a plurality of portions of the bottom dielectric layer is spaced by a plurality of portions of the conductive corrosion-barrier layer, the delivery loading plate is at the plurality of portions of the bottom dielectric layer, and the delivery loading plate is not in contact with the plurality of portions of the conductive corrosion-barrier layer.

2. The multi-layer circuit board according to claim 1, wherein the bottom-layer circuit is protruding from the bottom dielectric layer and the top-layer circuit is protruding from the top dielectric layer.

3. The multi-layer circuit board according to claim 2, wherein the multi-layer circuit structure further comprises an inner dielectric layer, an inner-layer circuit, a first conduction pillar, a second conduction pillar, and a third conduction pillar, the inner dielectric layer is connected to the top side of the bottom-layer circuit, the inner-layer circuit is connected between the inner dielectric layer and the top dielectric layer, the inner-layer circuit is protruding from the inner dielectric layer, the first conduction pillar downwardly inserts on the bottom dielectric layer and the first conduction pillar is connected between the electrical connection layer and the bottom-layer circuit, the second conduction pillar downwardly inserts on the inner dielectric layer and the second conduction pillar is connected between the bottom-layer circuit and the inner-layer circuit, the third conduction pillar downwardly inserts on the top dielectric layer and the third conduction pillar is connected between the top-layer circuit and the inner-layer circuit, the top-layer circuit is electrically connected to the conductive corrosion-barrier layer through the third conduction pillar, the inner-layer circuit, the second conduction pillar, the bottom-layer circuit, the first conduction pillar, and the electrical connection layer.

4. The multi-layer circuit board according to claim 1, wherein the conductive corrosion-barrier layer and the electrical connection layer are embedded on the bottom dielectric layer, wherein the electrical connection layer and the bottom dielectric layer are made of different materials.

5. The multi-layer circuit board according to claim 2, wherein the conductive corrosion-barrier layer and the electrical connection layer are embedded on the bottom dielectric layer, wherein the electrical connection layer and the bottom dielectric layer are made of different materials.

6. The multi-layer circuit board according to claim 3, wherein the conductive corrosion-barrier layer and the electrical connection layer are embedded on the bottom dielectric layer, wherein the electrical connection layer and the bottom dielectric layer are made of different materials.

7. The multi-layer circuit board according to claim 1, wherein the patterned metal interface layer comprises copper.

8. The multi-layer circuit board according to claim 2, wherein the patterned metal interface layer comprises copper.

9. The multi-layer circuit board according to claim 3, wherein the patterned metal interface layer comprises copper.

10. The multi-layer circuit board according to claim 1, further comprising a solder mask layer, wherein the solder mask layer exposes the top-layer circuit to cover the top dielectric layer.

11. The multi-layer circuit board according to claim 2, further comprising a solder mask layer, wherein the solder mask layer exposes the top-layer circuit to cover the top dielectric layer.

12. The multi-layer circuit board according to claim 3, further comprising a solder mask layer, wherein the solder mask layer exposes the top-layer circuit to cover the top dielectric layer.

13. The multi-layer circuit board according to claim 3, wherein a surface of the electrical connection layer is in contact with a protruding portion of the first conduction pillar.

14. The multi-layer circuit board according to claim 13, wherein a protruding portion of the third conduction pillar is in contact with a surface of the second conduction pillar, and a protruding portion of the second conduction pillar is in contact with a surface of the first conduction pillar, and the surface of the first conduction pillar is opposite to the protruding portion of the first conduction pillar.

15. The multi-layer circuit board according to claim 4, wherein the electrical connection layer is made of copper and the bottom dielectric layer is a plastic sheet made of bismaleimide triazine and glass fiber.

16. The multi-layer circuit board according to claim 1, wherein the plurality of portions of the conductive corrosion-barrier layer is isolated from each other.

17. The multi-layer circuit board according to claim 1, wherein at least one of the plurality of portions of the bottom dielectric layer is not positioned at an edge of the multi-layer circuit board, and the at least one of the plurality of portions of the bottom dielectric layer is in contact with the delivery loading plate.

18. The multi-layer circuit board according to claim 1, wherein a portion of the delivery loading plate is not positioned at an edge of the multi-layer circuit board in a horizontal direction.

* * * * *